United States Patent [19]

Betts et al.

[11] Patent Number: 4,862,464
[45] Date of Patent: Aug. 29, 1989

[54] DATA ERROR DETECTOR FOR DIGITAL MODEMS USING TRELLIS CODING

[75] Inventors: William L. Betts, St. Petersburg; Edward S. Zuranski, Largo, both of Fla.

[73] Assignee: Paradyne Corporation, Largo, Fla.

[21] Appl. No.: 139,449

[22] Filed: Dec. 30, 1987

[51] Int. Cl.[4] ............................................. G06F 11/10
[52] U.S. Cl. ...................................................... 371/43
[58] Field of Search ......................... 371/43, 44, 45, 46, 371/37

[56] References Cited

U.S. PATENT DOCUMENTS

| 4,087,787 | 5/1978 | Acampora | 371/43 |
| 4,583,236 | 4/1986 | Kromer | 371/46 X |
| 4,709,377 | 11/1987 | Martinez | 371/43 X |
| 4,745,625 | 5/1988 | Eyuboglu | 371/43 X |

Primary Examiner—Jerry Smith
Assistant Examiner—Robert W. Beausoliel
Attorney, Agent, or Firm—Kane, Dalsimer, Sullivan, Kurucz, Levy, Eisele and Richard

[57] ABSTRACT

A method and system for data error detection for digital modems using trellis coding makes use of a sixteen traceback Viterbi decoder. One embodiment of the invention comprises a circuit which receives a digital data stream from a communications channel such as a telephone line, passes it through conventional elements including a modem demodulator, adaptive equalizer, and slicer and metric calculation module, and then conducts the output of the calculation module to a parallel combination of a sixteen traceback truncated Viterbi decoder and a sixteen symbol delay line. The parallel outputs of the Viterbi decoder and delay line are conveyed to a "EXCLUSIVE NOR" gate wherein an output of "1" indicates error free data.

8 Claims, 1 Drawing Sheet

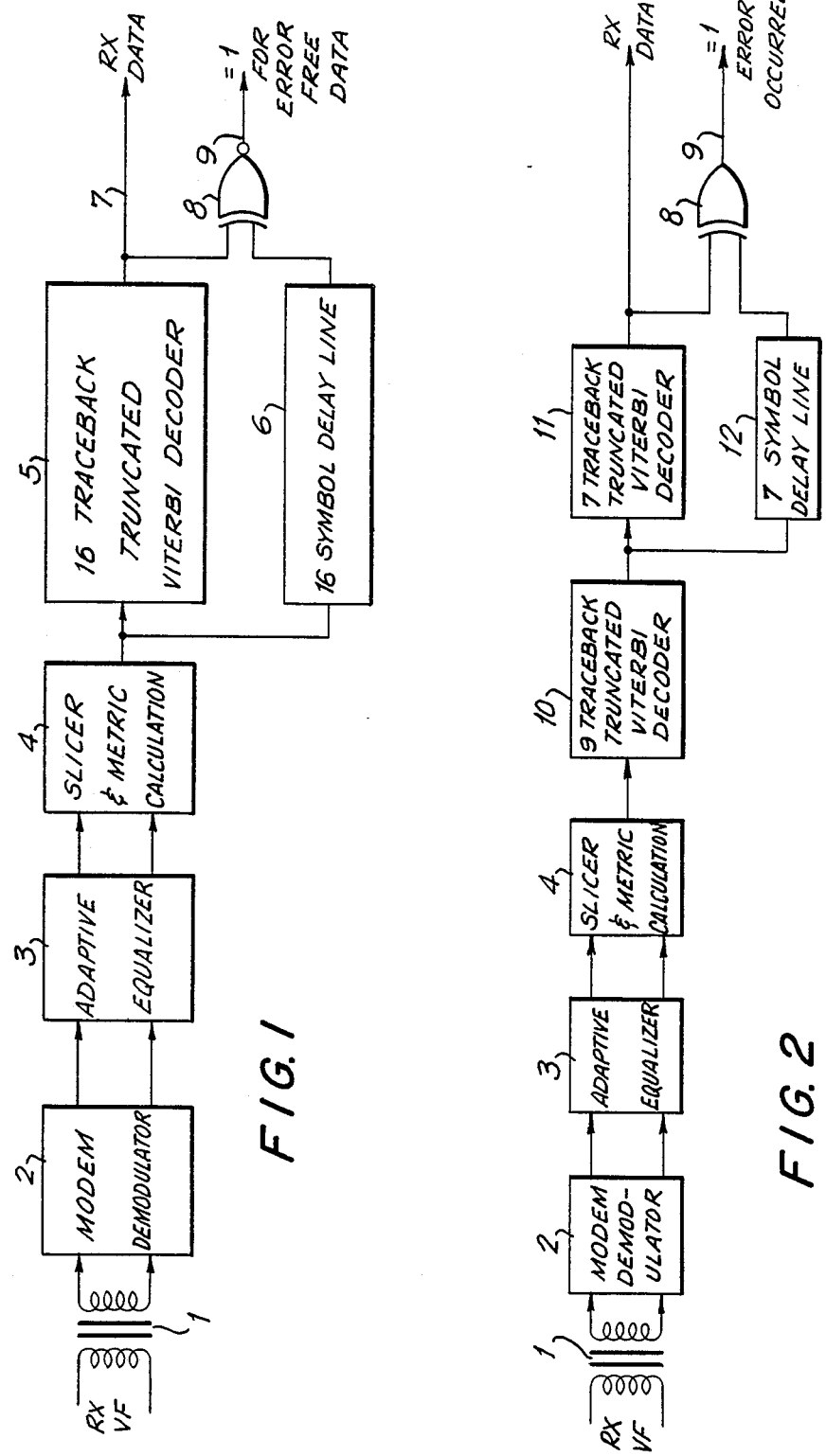

DATA ERROR DETECTOR FOR DIGITAL MODEMS USING TRELLIS CODING

BACKGROUND OF THE INVENTION

1. Field of the Invention

The invention relates to a method and system for detecting errors in a digital data stream being received by a modem after it has been sent by one or more modems over communication channels such as telephone lines.

2. Description of the Prior Art

Digital modems require a means to detect when errors are likely to be occurring in the digital data stream being received. Error detectors currently in use typically flash a warning light when conditions are marginal or to indicate that the modem needs to retrain due to a loss of synchronization with the modem(s) at the other end of the communications link. A crucial need of many modems presently in use is the need to determine the data error rate so that the modem can adapt its maximum data rate to particular transmission channel conditions.

Modems presently in use error signals derived from the demodulation function. These error signals are derived by subtracting a received demodulation symbol from an ideal reference symbol. The error signals are averaged over a period of time and the average value is compared to a reference threshold. Since averaging is involved, this method may not accurately predict data errors in the presence of short term transients such as impulse hits.

SUMMARY OF THE INVENTION

The invention comprises a method and system which closely predicts the error rate of the data received by a digital modem. This indicator provides error rates for both steady state impairments such as noise and transients impairments such as impulse hits. The invention also provides an indication that errors are not occurring which is useful in adaptive rate modems.

The method of the invention provides an indication of data errors (or the lack of data errors) by determining whether or not a Trellis code decoder algorithm has applied any corrections to the raw received data stream. The Trellis code decoder algorithm in this invention uses an eight state convolutional encoder with a sixteen traceback truncated Viterbi decoder. Other trellis codes, and more generally, all Viterbi decoders can be used in this invention.

The method of the present invention provides an error free data input by comparing the raw uncorrected data with the same data "corrected" by the Viterbi decoder. The received encoded data is entered into both the sixteen traceback Viterbi decoder and a sixteen symbol delay line. If no differences are detected for some length of time between the outputs of the Viterbi decoder and the delay line, a high probability of error free data reception can be postulated.

The detection of differences between the outputs of the Viterbi decoder and the delay line described above is not necessarily indicative of data errors because of the approximately three dB correction margin or coding gain of the trellis decoder. To provide essentially all the practical coding gain possible, a rule of thumb states that the traceback of a truncated Viterbi decoder must be approximately three to five times the constraint length (number of memory elements) in the trellis encoder. In the preferred embodiment of the present invention the constraint length is three. At nine traceback steps most of the coding gain possible has been achieved and consequently most error correction, if any, will have occurred at this point. The additional seven traceback steps provide only a small gain over the initial nine steps so that any difference between the ninth and sixteenth traceback outputs will, in the majority of cases, indicate that the traceback has diverged and a data error has occurred.

In a separate embodiment of the invention the aforementioned sixteen traceback Viterbi decoder is split into two cascaded Viterbi decoders respectively having nine traceback steps and seven traceback steps. The output of the nine traceback step decoder is stored in a seven symbol delay line. Errors are counted when the output of the delay line is different from the output of the second traceback section.

The basic circuit of the present invention comprises series connection of a modem demodulator, adaptive equalizer, and a slicer and metric calculation module. The output of the slicer and metric calculation module is fed into a parallel combination of a sixteen traceback truncated Viterbi decoder and a sixteen symbol delay line. The outputs of the sixteen traceback truncate Viterbi decoder and sixteen symbol delay line are each conveyed to an "EXCLUSIVE NOR" gate whose output is "1" for error free data.

The other embodiment of the invention comprises the same circuit elements except that instead of the sixteen traceback truncated Viterbi decoder there is a nine traceback truncated Viterbi decoder in series with a seven traceback truncated Viterbi decoder which, in turn, is in parallel with a seven symbol delay line.

The conventional sixteen traceback truncated Viterbi decoder for a constraint length of three has eight paths of sixteen symbol delay lines. This invention adds one sixteen symbol delay line path. For higher order constraint numbers, the number of paths doubles with each increasing increment of constraint length. Thus, for constraint length four sixteen paths are required with 32 symbol delay lines plus one 32 symbol delay line for the error detector.

BRIEF DESCRIPTION OF THE DRAWINGS

FIG. 1 is a schematic of the preferred embodiment of the present invention.

FIG. 2 is a schematic of another embodiment of the present invention.

DETAILED DESCRIPTION OF THE INVENTION

FIG. 1 shows a schematic of the preferred embodiment of the invention wherein a data stream from a communications channel such as a telephone line (not shown) enters transformer 1 and passes through modem demodulator 2 to reach adaptive equalizer 3. The output of the adaptive equalizer 3 is conveyed to a slicer and metric calculation module 4 which in turn produces parallel outputs to 16 traceback truncated Viterbi decoder 5 and 16 symbol delay line 6. One output of the sixteen traceback truncated Viterbi decoder 5 is conveyed on line 7 in an unchanged form as received data.

Another output of sixteen traceback truncated Viterbi decoder 5 as well as an output of sixteen symbol delay line module 6 is conveyed to "EXCLUSIVE NOR" gate 8. If the "EXCLUSIVE NOR" gate produces a "1" signal on line 9, this is an indication of error free data.

FIG. 2 shows a slightly modified embodiment of the invention. As shown therein elements having the same function as in FIG. 1 are designated with the same reference numerals. Thus transformer 1, modem demodulator 2, adaptive equalizer 3, and slicer and metric calculation module 4 operate in the same fashion as in FIG. 1. The difference between the circuit of FIG. 1 and that of FIG. 2 is that in FIG. 2 the elements nine, traceback truncated Viterbi decoder 10, and the elements seven traceback Viterbi decoders and seven symbol delay line 12, the latter two of which have parallel inputs from nine traceback truncated Viterbi decoder 10 function in a slightly different fashion from elements 5 and 6 of FIG. 1 as was indicated in the Summary Of The Invention. As stated therein, since at nine traceback steps most of the coding gain possible has been achieved, most error correction if any has occurred at this point. The additional seven traceback steps provide only a small gain over the initial 9 steps so any difference between the ninth and sixteenth traceback outputs will, in the majority of cases, indicate that the traceback has diverged and a data error has occurred. Thus, in FIG. 2, the output of the nine traceback truncated Viterbi decoder is passed through the seven symbol delay line module 12 and then parallelly input into "EXCLUSIVE NOR" gate 8 together with the output of seven traceback truncated Viterbi decoder 11. An output of "1" from "EXCLUSIVE NOR" gate 8 on line 9 indicates that an error has occurred.

Although preferred embodiments of the invention have been shown herein, it should be understood that many modifications thereof would be obvious within the scope of the appended claims.

What is claimed is:

1. A data error detector circuit for digital modems comprising:
    means for receiving an analog signal representative of a digital data stream from a communications channel and for reconstituting said signal in digital form;
    a parallel combination of a traceback truncated Viterbi decoder and a symbol delay line, said decoder and said symbol delay line being connected to an output of said receiving and reconstituting means; and
    logic means having inputs from said traceback Viterbi decoder and said symbol delay line and functioning to produce a relatively positive output when error free data is being received from said communications channel.

2. The data error circuit of claim 1 wherein said logic means comprises an "EXCLUSIVE-NOR" gate.

3. The data error circuit of claim 1 wherein the number of symbols in the delay line and in the traceback truncated Viterbi decoder are the same.

4. The data error circuit of claim 1 wherein said receiving and reconstituting means comprises a series connection of a modem demodulator, an adaptive equalizer, and a slicer and metric calculation module.

5. A data error circuit for digital modems comprising:
    means for receiving an analog signal representative a digital data stream from a communications channel and for reconstituting said signal in digital form;
    a first traceback truncated Viterbi decoder connected to an output of said receiving and reconstituting means;
    a parallel combination of a second traceback truncated Viterbi decoder and a symbol delay line, said second decoder and said symbol delay line being connected to an output of said receiving and reconstituting means; and
    logic means having inputs from said second traceback Viterbi decoder and said symbol delay line and functioning to produce a positive output when an error occurs in the data being received from said communications channel.

6. The data error circuit of claim 5 wherein said logic means comprises an "EXCLUSIVE-NOR" gate.

7. The data error circuit of claim 5 wherein the number of symbols in the delay line and in the second traceback Viterbi decoder are the same.

8. The data error circuit of claim 5 wherein said receiving and constituting means comprises a series connection of a modem demodulator, an adaptive equalizer, and a slicer and metric calculation module.

* * * * *